United States Patent
Tay et al.

(10) Patent No.: US 11,330,706 B2
(45) Date of Patent: May 10, 2022

(54) COMPONENT CARRIER WITH EMBEDDED LARGE DIE

(71) Applicant: AT&S (China) Co. Ltd., Shanghai (CN)

(72) Inventors: Seok Kim Tay, Singapore (SG); Mikael Tuominen, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/680,768

(22) Filed: Nov. 12, 2019

(65) Prior Publication Data

US 2020/0163205 A1 May 21, 2020

(30) Foreign Application Priority Data

Nov. 21, 2018 (CN) .......................... 201811393259.1

(51) Int. Cl.
*H05K 1/18* (2006.01)
*H05K 1/11* (2006.01)
(Continued)

(52) U.S. Cl.
CPC ........... *H05K 1/0271* (2013.01); *H05K 1/186* (2013.01); *H05K 3/22* (2013.01); *H01L 23/5389* (2013.01);
(Continued)

(58) Field of Classification Search
CPC ......... H05K 1/0271; H05K 3/22; H05K 1/186
See application file for complete search history.

(56) References Cited

U.S. PATENT DOCUMENTS

| | | | |
|---|---|---|---|
| 7,038,310 B1 * | 5/2006 | Nakatani | H01L 21/568 257/706 |
| 2002/0185303 A1 * | 12/2002 | Takeuchi | H01L 21/568 174/256 |

(Continued)

FOREIGN PATENT DOCUMENTS

| | | |
|---|---|---|
| CN | 1886026 A | 12/2006 |
| CN | 107424981 A | 12/2017 |

(Continued)

OTHER PUBLICATIONS

Li, Yun, Examination Department: Electrical Invention Examination Department, Search Report (English translation) in Application No. 201811393259.1, pp. 1-3; Jul. 30, 2019; Hubei Center of the Patent Office, CNIPA.

(Continued)

*Primary Examiner* — Ishwarbhai B Patel
(74) *Attorney, Agent, or Firm* — Robert A. Blaha; Smith Tempel Blaha LLC (57) ABSTRACT

A component carrier includes a stack having at least one electrically conductive layer structure and/or at least one electrically insulating layer structure; a component embedded in the stack so that a gap of less than 100 μm, in particular less than 60 μm, remains between at least one sidewall of the component and a sidewall of an adjacent one of the layer structures or a further component embedded in the stack; and a filler medium including filler particles, wherein the filler medium at least partially fills the gap. In addition, a method of manufacturing a component carrier is provided.

18 Claims, 2 Drawing Sheets

(51) Int. Cl.
*H05K 1/02* (2006.01)
*H05K 3/22* (2006.01)
*H01L 23/538* (2006.01)

(52) U.S. Cl.
CPC ............... *H05K 1/11* (2013.01); *H05K 1/182* (2013.01); *H05K 1/185* (2013.01); *H05K 2201/0209* (2013.01)

(56) References Cited

U.S. PATENT DOCUMENTS

| | | | |
|---|---|---|---|
| 2004/0152803 A1 | 8/2004 | Ahsan | |
| 2005/0048291 A1 | 3/2005 | Woo et al. | |
| 2006/0291173 A1 | 12/2006 | Cho et al. | |
| 2007/0045814 A1* | 3/2007 | Yamamoto | H01G 4/236 |
| | | | 257/698 |
| 2010/0084175 A1* | 4/2010 | Suzuki | H01L 21/4857 |
| | | | 174/260 |
| 2012/0085572 A1* | 4/2012 | Sakai | H01L 23/5389 |
| | | | 174/258 |
| 2013/0074332 A1* | 3/2013 | Suzuki | H05K 3/4602 |
| | | | 29/834 |
| 2013/0088841 A1* | 4/2013 | Ohshima | H05K 1/025 |
| | | | 361/761 |
| 2014/0144686 A1* | 5/2014 | Shimizu | H05K 1/185 |
| | | | 174/258 |
| 2014/0182889 A1* | 7/2014 | Shin | H05K 3/4673 |
| | | | 174/251 |
| 2014/0186593 A1* | 7/2014 | Seo | C08G 59/1483 |
| | | | 428/195.1 |
| 2015/0216066 A1* | 7/2015 | Zhang | B23K 1/0008 |
| | | | 361/767 |
| 2016/0165732 A1* | 6/2016 | Moon | H01L 23/49822 |
| | | | 361/762 |
| 2016/0270233 A1 | 9/2016 | Ha | |
| 2016/0336247 A1 | 11/2016 | Yu et al. | |
| 2017/0034923 A1* | 2/2017 | Lin | H05K 3/4647 |
| 2017/0275453 A1 | 9/2017 | Nakamata et al. | |
| 2017/0295643 A1 | 10/2017 | Suzuki et al. | |
| 2017/0339783 A1* | 11/2017 | Stahr | H05K 3/4602 |
| 2018/0213634 A1* | 7/2018 | Tuominen | H01L 23/3737 |
| 2021/0204414 A1* | 7/2021 | Okamoto | H01L 23/12 |

FOREIGN PATENT DOCUMENTS

| | | |
|---|---|---|
| CN | 108347820 A | 7/2018 |
| JP | 2005039158 A | 2/2005 |
| KR | 101253514 B1 | 4/2013 |
| WO | 02/27786 A1 | 4/2002 |

OTHER PUBLICATIONS

First Office Action in Application 201811393259.1, pp. 1-10; Aug. 7, 2019; Receiving Section of the CPO, No. 6 Xitucheng Road, Haidian District, Beijing, 100088; The State Intellectual Property Office of P.R. China.

Second Office Action in Application 201811393259.1; pp. 1-9; Nov. 1, 2019; The State Intellectual Property Office of P.R. China.

* cited by examiner

COMPONENT CARRIER WITH EMBEDDED LARGE DIE

CROSS-REFERENCE TO RELATED APPLICATION

This application claims the benefit of the filing date of Chinese Patent Application No. 201811393259.1, filed Nov. 21, 2018, the disclosure of which is hereby incorporated herein by reference.

TECHNICAL FIELD

Embodiments of the invention relate to a component carrier, to methods of manufacturing a component carrier and to a method of using filler particles. In particular, embodiments of the invention relate to a component carrier having a large component, more specifically a large die, embedded therein.

Technological Background

In the context of growing product functionalities of component carriers equipped with one or more components and increasing miniaturization of such components as well as a rising number of components to be mounted on component carriers such as printed circuit boards (PCBs), increasingly more powerful array-like components or packages having several components are being employed, which have a plurality of contacts or connections, with ever smaller spacing between these contacts. Embedding technology is continuously evolving and instead of standard PCB embedding, an increasing focus is made on embedding technology for large dies to take a share from traditional packaging industries.

SUMMARY

There may be a need to provide a component carrier wherein a large component, more specifically a large die, may be embedded in an efficient and reliable manner.

A component carrier and a method of manufacturing a component carrier according to the independent claims are provided.

According to an exemplary embodiment of the invention, a component carrier is provided, which comprises a stack comprising at least one electrically conductive layer structure and/or at least one electrically insulating layer structure; a component embedded in the stack so that a gap of less than 100 μm, in particular less than 60 μm, remains between at least one sidewall of the component and a sidewall of an adjacent one of the layer structures or a further component embedded in the stack; and a filler medium comprising filler particles, wherein the filler medium at least partially fills the gap.

According to another exemplary embodiment of the invention, a method of manufacturing a component carrier is provided. The method comprises the steps of forming a stack comprising at least one electrically conductive layer structure and/or at least one electrically insulating layer structure, embedding a component in the stack so that a gap of less than 100 μm remains between at least one sidewall of the component and a sidewall of an adjacent one of the layer structures or a further component embedded in the stack, and at least partially filling the gap with a filler medium comprising filler particles.

In an embodiment, the filler medium comprising filler particles comprises (or is derived from) material of the electrically insulating layer structure and the at least partially filling the gap with a filler medium comprises a pressing of material of the electrically insulating layer structure into the gap. In such an embodiment, the material of the electrically insulating layer structure may comprise filler particles, which may be pressed into the gap by means of a compression step. By taking this measure, the gap may be at least partially filled with a filler medium comprising filler particles in a very cost-efficient manner.

Overview of Embodiments

In the following, further exemplary embodiments of the component carrier as well as of the method of manufacturing a component carrier will be explained. However, the present invention is not limited to the following specific descriptions of exemplary embodiments, but they are rather for illustrative purposes only.

It should be noted that features described in connection with one exemplary embodiment or exemplary aspect may be combined with any other exemplary embodiment or exemplary aspect, in particular features described with any exemplary embodiment of a component carrier may be combined with any other exemplary embodiment of a component carrier and any exemplary embodiment of a method of manufacturing a component carrier and vice versa, unless specifically stated otherwise.

Where an indefinite or definite article is used when referring to a singular term, such as "a", "an" or "the", a plural of that term is also included and vice versa, unless specifically stated otherwise, whereas the word "one" or the number "1", as used herein, typically means "just one" or "exactly one".

It should be noted that the term "comprising" does not exclude other elements or steps and, as used herein, includes not only the meaning of "comprising", "including" or "containing", but also encompasses "consisting essentially of" and "consisting of".

Unless specifically stated otherwise, the expressions "at least partially", "at least partly", "at least part of" or "at least a part of", as used herein, may mean at least 1% thereof, in particular at least 5% thereof, in particular at least 10% thereof, in particular at least 15% thereof, in particular at least 20% thereof, in particular at least 25% thereof, in particular at least 30% thereof, in particular at least 35% thereof, in particular at least 40% thereof, in particular at least 45% thereof, in particular at least 50% thereof, in particular at least 55% thereof, in particular at least 60% thereof, in particular at least 65% thereof, in particular at least 70% thereof, in particular at least 75% thereof, in particular at least 80% thereof, in particular at least 85% thereof, in particular at least 90% thereof, in particular at least 95% thereof, in particular at least 98% thereof, and may also include 100% thereof.

In an embodiment, the gap between at least one sidewall of the component and a sidewall of an adjacent one of the layer structures or a further component embedded in the stack, such as a clearance of the gap or a distance between these sidewalls, is less than 100 μm, in particular less than 80 μm, in particular less than 60 μm, in particular less than 50 μm, in particular less than 40 μm. The gap between at least one sidewall of the component and a sidewall of an adjacent one of the layer structures or a further component embedded in the stack may be for instance more than 1 μm, in particular more than 2 μm, in particular more than 5 μm.

In an embodiment, the component is embedded in the stack so that a gap of less than 100 μm remains between at least one sidewall of the component and a sidewall of an adjacent layer structure, in particular a sidewall of an adjacent insulating layer structure, which may form a core sandwiched between electrically conductive layer structures.

In an embodiment, the component is embedded in the stack so that a gap of less than 100 µm remains between at least one sidewall of the component and a sidewall of a further component embedded in the stack. By taking this measure, a component carrier equipped with more than one component in a very compact manner may be obtained. The further component may be of the same type as the (first) component or it may be of another type as the (first) component. For example, the (first) component may be an active component and the further component may be a passive component.

In an embodiment, the filler medium comprises filler particles and the filler medium at least partially fills the gap. The filler medium may in particular completely fill the gap between at least one sidewall of the component and a sidewall of an adjacent one of the layer structures or a further component embedded in the stack. The filler medium is not particularly limited and may include for instance an electrically conductive material and/or an electrically insulating material, such as a dielectric material.

In an embodiment, the component has a ratio of length to thickness of more than 5, for instance of more than 10. For instance, the component may have a ratio of length to thickness of less than 70, such as of less than 50. Such a component may also be referred to as a "large component" or a "large die" herein.

In an embodiment, a ratio between a lateral extension of the component carrier and a lateral extension of the component is less than 3.5, for instance less than 3. In particular, a ratio between a lateral extension of the component carrier and a lateral extension of the component may be more than 0.5, such as more than 1.0.

In an embodiment, the filler particles comprise a dielectric material.

In an embodiment, the filler particles comprise a ceramic material (such as quartz or aluminum oxide) and/or an amorphous material (such as glass).

In an embodiment, the filler particles comprise at least one selected from the group consisting of quartz, aluminum oxide or glass.

In an embodiment, the filler particles have an average particle size (or average particle diameter) of less than 30 µm, in particular less than 10 µm. For instance, the average particle size of the filler particles may be in a range of from 1 nm to 15 µm, such as from 5 nm to 10 µm, such as from 10 nm to 5 µm, such as from 25 nm to 2.5 µm, such as from 50 nm to 1 µm.

In an embodiment, the filler particles are nanoparticles (which may also be referred to as "nano-fillers"). The term "nanoparticles", as used herein, may in particular denote particles having an average particle size (or average particle diameter) in the range of from 10 to 10,000 nm, in particular of from 25 to 1000 nm, in particular of from 50 to 500 nm.

Filler particles having the above-described average particle size or nanoparticles may enable a substantially complete or full encapsulation of the component in the restricted physical space provided by the small gap and may thereby ensure a robust process and product.

The determination of an average particle size (or average particle diameter) is known to a person skilled in the art and can be performed for instance by visual microscopic observation with an appropriate magnification, for instance by using an electron microscope (such as a transmission electron microscope, TEM) and by randomly selecting an appropriate number of particles and calculating the average of the individual particle diameters. The determination of an average particle size (or average particle diameter) can also be performed for instance using light diffraction, for instance dynamic light scattering, for instance using X-ray diffraction, of an appropriate sample size and particle concentration.

The shape of the filler particles is not particularly limited, and any shape thereof, such as spherical, polyhedral, regular or irregular, may be suitable.

The filler particles may be of a core/shell type or the filler particles may have a homogeneous (uniform) constitution.

In an embodiment, a ratio between a size (such as the average particle size or the average particle diameter) of the filler particles and the (clearance of the) gap is less than 70%, in particular less than 50%, in particular less than 20%. In particular, the ratio between the size (such as the average particle size or the average particle diameter) of the filler particles and the gap may be more than 1%, such as more than 5%. For instance, if the gap between at least one sidewall of the component and a sidewall of an adjacent one of the layer structures or a further component embedded in the stack, is 50 µm, it might be advantageous if the filler particles have an average particle size of less than 35 µm (i.e. a ratio between the average particle size of the filler particles and the gap being less than 70%), in particular less than 25 µm (i.e. a ratio between the average particle size of the filler particles and the gap being less than 50%), in particular less than 10 µm (i.e. a ratio between the average particle size of the filler particles and the gap being less than 20%).

In an embodiment, a volume percentage of filler particles in the filler medium and/or in the gap is from 30% to 95%, such as from 40% to 90%, in particular from 50% to 80%. For instance, a volume percentage of filler particles in the filler medium may be from 30% to 95%. Additionally or alternatively, a volume percentage of filler particles in the gap may be from 30% to 95%.

In an embodiment, (at least a part of) the electrically insulating layer structure comprises filler particles.

In an embodiment, the electrically insulating layer structure comprises one or more electrically insulating materials. At least of one these electrically insulating materials may comprise filler particles. For instance, a first electrically insulating material comprising filler particles may be used for at least partially filling the gap between at least one sidewall of the component and a sidewall of an adjacent one of the layer structures or a further component embedded in the stack, such as by being pressed into the gap by means of a compression step, and a second electrically insulating material (which may be the same as or different from the first electrically insulating material), and optionally a third electrically insulating material (which may be the same as or different from the first and/or the second electrically insulating material) may be used for at least partially covering the component on an upper and/or lower side thereof. For instance, a second electrically insulating material may be used for at least partially covering the component on an upper side thereof and a third electrically insulating material may be used for at least partially covering the component on a lower side thereof. The second and/or the third electrically insulating material may optionally also comprise filler particles.

In an embodiment, the electrically insulating layer structure has a coefficient of thermal expansion (CTE) value below 30 ppm/° C., in particular below 15 ppm/° C. On the other hand, the electrically insulating layer structure may have a coefficient of thermal expansion (CTE) value of more than 0.5 ppm/° C., in particular more than 1 ppm/° C.

In an embodiment, the component carrier further comprises electrically conductive connections, in particular electrically conductive connections to the component. Electrically conductive connections to the component may be portions of electrically conductive material in close proximity, in particular in physical contact, to the component. Electrically conductive connections to the component may be provided at at least one, two, three, four, five or all six sides of the component.

In an embodiment, the electrically conductive connections may be comprised or included in an electrically insulating layer structure. For instance, the electrically conductive connections may be vias, which may provide electrical connections to the component.

In an embodiment, the electrically conductive connections are surrounded by the filler particles.

In an embodiment, the electrically conductive layer structure may be structured or patterned. In an alternative embodiment, the electrically conductive layer structure may be continuous.

In an embodiment, the electrically conductive layer structure may be electrically connected to the component by means of electrically conductive connections, such as vias.

In an embodiment, the electrically conductive layer structure may be at least partially covered by an electrically insulating layer structure, which may serve as a compensation layer. For instance, the electrically insulating layer structure at least partially covering the electrically conductive layer structure may be configured for compensating unevenness or warping.

In an embodiment, the component is at least partially surrounded by the filler particles. For instance, at least one, two, three, four or five sides of the component are surrounded by the filler particles.

In an embodiment, the component is substantially completely surrounded by the filler particles.

In an embodiment, the filler particles are contained substantially only in the gap between at least one sidewall of the component and a sidewall of an adjacent one of the layer structures or a further component embedded in the stack.

In an embodiment, the adjacent one of the layer structures (which may also be simply referred to as "adjacent layer structure") may be selected from the group consisting of a core (such as prepreg sandwiched between electrically conductive layer structures, such as copper layers), an electrically insulating layer structure (such as prepreg material or an epoxy-based build-up material), a metal core (such as made of copper) and a multilayer setup (such as a stack of at least one electrically conductive layer structure and at least one electrically insulating layer structure).

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up material (such as epoxy-based build-up film), polytetrafluoroethylene (Teflon), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

In an embodiment, the substrate or interposer may consist of at least a layer of glass, silicon (Si) or a photo-imageable or dry-etchable organic material like epoxy-based build-up films or polymer compounds like polyimide, polybenzoxazole, or benzocyclobutene.

DETAILED DESCRIPTION OF ILLUSTRATED EMBODIMENTS

The aspects defined above and further aspects of the invention are apparent from the exemplary embodiments to be described hereinafter and are explained with reference to these exemplary embodiments.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier is provided, which comprises a large component, more specifically a large die, embedded in a stack comprising at least one electrically conductive layer structure and/or at least one electrically insulating layer structure.

The basic problematics of embedding large dies are related to the conceptual construction of the embedded package. With the traditional embedding technology the main target applications were passive components and small dies with typically length to thickness ratio <5 times. Meaning the X, Y length/width of the package was not more than maximum 3 times of the thickness of the die. The basic problems were related to component damage of the large dies and resin filling of the cavity area surrounding the component. One of the key problematics restricting the embedding of larger devices has been a mechanical stress applied during the lamination process and other further processing processes. Leaving an extensive gap (for instance large cavities with a clearance of more than 100 μm) between the core and the die allows the pressure to be directly applied on the device and causes the brittle silicon or other related materials to crack. A key innovation according to an exemplary embodiment of the invention was to develop a production concept where the edge of the component can be brought relatively close to the edge of the core, thereby causing the core to absorb most of the vertically applied stress and to avoid the crack of the brittle materials. This mechanical stress reduction concept may be in particular implemented according to an exemplary embodiment of the invention by embedding an in particular large component or die in a stack comprising at least one electrically conductive layer structure and/or at least one electrically insulating layer structure so that a gap of less than 100 μm, in particular less than 60 μm, remains between at least one sidewall of the component and a sidewall of an adjacent one of the layer structures or a further component embedded in the stack.

Another key problematic arises from the narrow space between the component and adjacent semi-finished component carrier. The standard materials are utilizing fillers that are necessary to stabilize the material and are often but not necessarily only made of silica materials. According to an exemplary embodiment of the invention, a filler medium comprising filler particles (in particular small-sized filler particles, such as nanoparticles or nano-fillers) at least partially fills the gap. Such nano-fillers are enabling a full encapsulation of the component in the restricted physical space. More specifically, materials with filler size <10 μm may guarantee a robust process and product.

Figure 1:
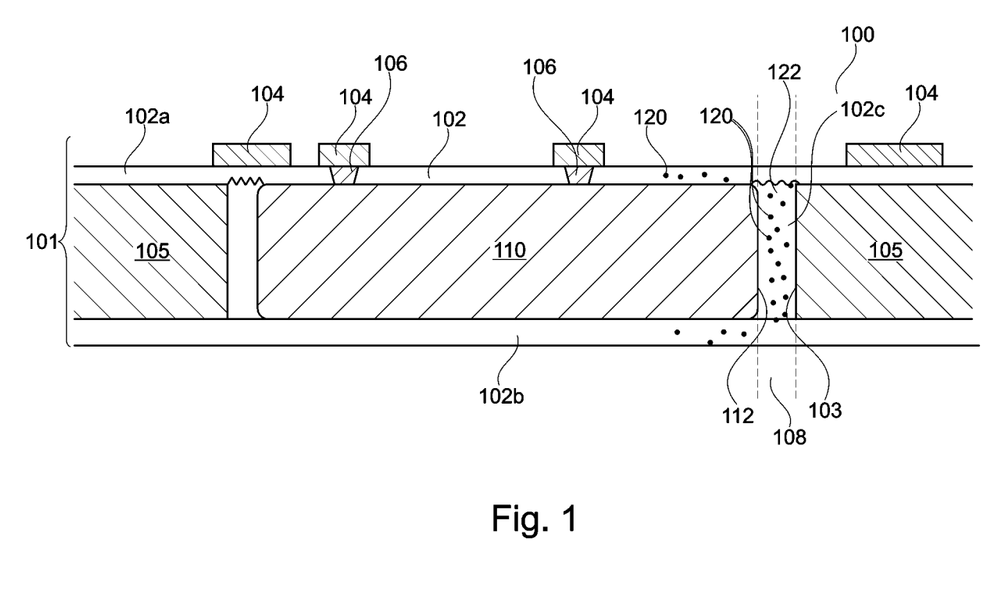
FIG. 1 illustrates a component carrier according to an exemplary embodiment of the invention.

FIG. 1 illustrates a component carrier 100 according to an exemplary embodiment of the invention.

The component carrier 100 comprises a stack 101 comprising at least one electrically conductive layer structure 104, which is embodied in the depicted embodiment as a structured or patterned upper electrically conductive layer structure 104 and at least one electrically insulating layer structure 102, which is embodied in the depicted embodiment as an upper and a lower electrically insulating layer structure 102a, 102b and an electrically insulating layer structure 102c within a gap 108. Alternatively or additionally, an electrically conductive layer structure (not shown in FIG. 1) may also be present at a lower side of the component 110 in alternative embodiments. For instance, an additional, preferably unpatterned (i.e. continuous) lower electrically conductive layer structure (not shown in FIG. 1), such as a copper layer, may be provided at a lower side of the component 110, which may improve heat removal from the component carrier 100, which may be in particular of relevance in case of high-power components.

The component carrier 100 further comprises a component 110, which is completely embedded within the stack 101 of electrically insulating layer structure 102 and electrically conductive layer structures 104 in the depicted embodiment. In alternative embodiments, the component 110 may also be only partly embedded within the stack 101 of electrically insulating layer structure 102 and electrically conductive layer structures 104.

In the depicted embodiment, the component carrier 100, more specifically the stack 101, further comprises electrically conductive connections 106, which are provided in proximity or adjacent to the component 110 and may therefore also be referred to as electrically conductive connections 106 to the component 110. In the depicted embodiment, the electrically conductive connections 106 are shown as vias electrically connecting the component 110 and the electrically conductive layer structure 104. The electrically conductive layer structure 104 may be at least partially covered by a further electrically insulating layer structure (not shown in FIG. 1), which may serve as a compensation layer.

In the embodiment shown in FIG. 1, there is a gap 108 between a sidewall 112 of the component 110 and a sidewall 103 of an adjacent layer structure 105. It should be noted that the dimensions of the gap 108 are not drawn to scale in FIG. 1 with regard to the dimensions of the component 110 of the electrically insulative and electrically conductive layer structures 102, 104 and of the adjacent layer structure 105. Rather, the gap 108 has been depicted broader for illustration purposes and its clearance is in fact less than 100 μm, in particular less than 60 μm. A filler medium 122 comprising filler particles 120 at least partially (in the depicted embodiment, substantially completely) fills the gap 108. In the depicted embodiment, the filler medium 122 comprises an electrically insulating layer structure 102c, for instance made of a first electrically insulating material comprising filler particles 120, and which is shown delimited from an upper electrically insulating layer structure 102a by a wavy line and from a lower electrically insulating layer structure 102b by a straight line in FIG. 1. Filler particles 120 may also be comprised in the upper and/or lower electrically insulating layer structures 102a, 102b, for instance made of a second electrically insulating material and a third electrically insulating material, respectively. In the depicted embodiment, a second electrically insulating material forming the upper electrically insulating layer structure 102a comprises filler particles 120, whereas a third electrically insulating material forming the lower electrically insulating layer structure 102b does not comprise filler particles. In alternative embodiments (not shown in FIG. 1), none of the upper and lower electrically insulating layer structures 102a, 102b comprise filler particles 120 or both of the upper and lower electrically insulating layer structures 102a, 102b comprise filler particles 120. The first, the second and the third electrically insulating material forming the electrically insulating layer structures 102c, 102a and 102b, respectively, may be the same (such as any two thereof or all three may be the same) or may be different from each other. In particular, filler particles 120 may be present in the gap 108 between the component 110 and the adjacent layer structure 105 as well as on at least one, such as at least two further sides of the component 110. In alternative embodiments, filler particles 120 may be present on all sides of the component 110, i.e. the component 110 may be completely surrounded by filler particles 120, or filler particles 120 may be present only in the gap 108 between the component 110 and the adjacent layer structure 105. In the depicted embodiment, the filler particles 120 are nanoparticles having an average particle diameter significantly smaller than the clearance of the gap.

Figure 2:
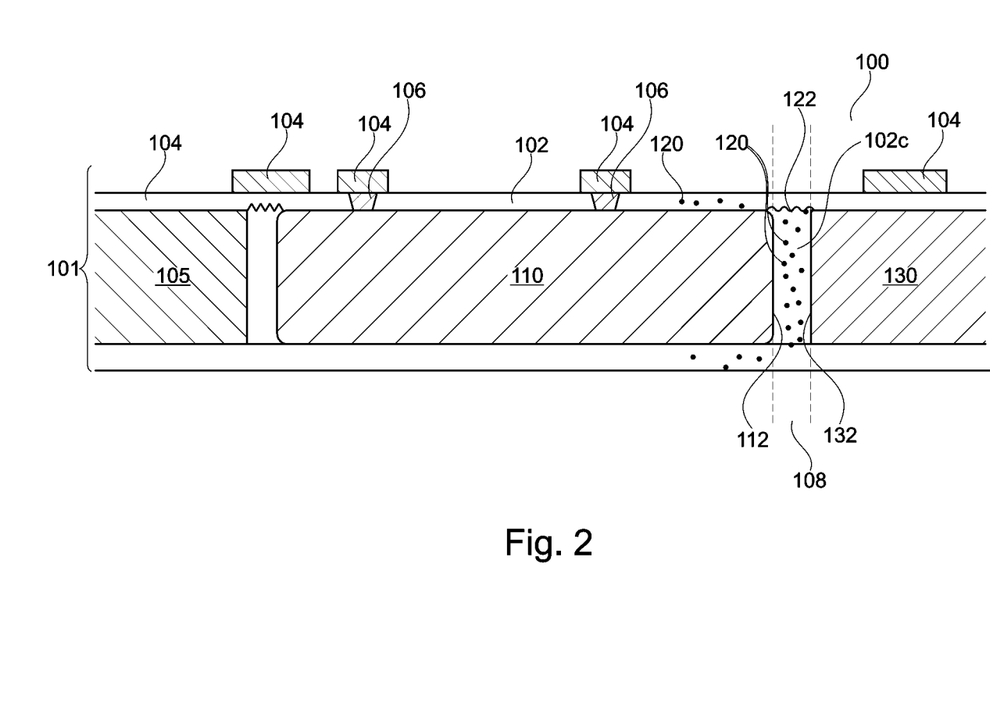
FIG. 2 illustrates a component carrier according to another exemplary embodiment of the invention.

FIG. 2 illustrates a component carrier 100 according to another exemplary embodiment of the invention. The component carrier 100 according to the exemplary embodiment of the invention shown in FIG. 2 is similar to the component carrier 100 according to the exemplary embodiment of the invention shown in FIG. 1, so that the description of like elements is not repeated.

In the embodiment shown in FIG. 2, and in contrast to the embodiment shown in FIG. 1, there is a gap 108 between a sidewall 112 of the component and a sidewall 132 of a further component 130. It should again be noted that the dimensions of the gap 108 are not drawn to scale in FIG. 2 with regard to the dimensions of the component 110 and of the further component 130. Rather, the gap 108 has been depicted broader for illustration purposes and its clearance is in fact less than 100 μm, in particular less than 60 μm. A filler medium 122 comprising filler particles 120 at least partially (in the depicted embodiment, substantially completely) fills the gap 108. As shown in FIG. 2 and similar to the embodiment shown in FIG. 1, filler particles 120 may also be comprised in upper and/or lower electrically insulating layer structures 102a, 102b adjacent to the component 110. In the depicted embodiment, the filler particles 120 are nanoparticles having an average particle diameter significantly smaller than the clearance of the gap. As can be taken from FIG. 2, a very compact architecture of a component carrier equipped with more than one component can be achieved.

It should be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

REFERENCE SIGNS

100 Component carrier
101 Stack
102, 102a, 102b, 102c Electrically insulating layer structure
103 Sidewall of an adjacent layer structure
104 Electrically conductive layer structure
105 Adjacent layer structure
106 Electrically conductive connections
108 Gap
110 Component
112 Sidewall of the component
120 Filler particles
122 Filler medium
130 Further component
132 Sidewall of the further component

The invention claimed is:

1. A component carrier, comprising:
a stack comprising at least one electrically conductive layer structure and/or at least one electrically insulating layer structure;
a component embedded in the stack so that a gap of less than 100 μm remains between at least one sidewall of the component and a sidewall of an adjacent one of the layer structures, wherein the component has a ratio of length to thickness of more than 10;
a filler medium comprising filler particles, wherein the filler medium at least partially fills the gap,
wherein the filler particles have an average particle size of less than 5 μm,
wherein a volume percentage of filler particles in the filler medium and/or in the gap is from 50% to 90%.

2. The component carrier according to claim 1, wherein a ratio between a length of the component carrier and a length of the component is less than 3.5.

3. The component carrier according to claim 1, wherein the filler particles comprise a dielectric material.

4. The component carrier according to claim 1, wherein the filler particles comprise a ceramic material and/or an amorphous material.

5. The component carrier according to claim 1, wherein the filler particles comprise at least one selected from the group consisting of quartz, aluminum oxide or glass.

6. The component carrier according to claim 1, wherein a ratio between a size of the filler particles and the gap is less than 70%.

7. The component carrier according to claim 1, wherein the electrically insulating layer structure has a coefficient of thermal expansion (CTE) value below 30 ppm/° C.

8. The component carrier according to claim 1, further comprising:
electrically conductive connections, in particular electrically conductive connections to the component.

9. The component carrier according to claim 8, wherein the electrically conductive connections are surrounded by the filler particles.

10. The component carrier according to claim 1, wherein the component, in particular an electronic component, is mounted on and/or embedded in the at least one electrically insulating layer structure and/or at least one electrically conductive layer structure.

11. The component carrier according to claim 1, wherein the component is selected from a group consisting of an electronic component, an electrically non-conductive and/or electrically conductive inlay, a heat transfer unit, a light guiding element, an active electronic component, a passive electronic component, an electronic chip, a storage device, a filter, an integrated circuit, a signal processing component, a power management component, an optoelectronic interface element, a light emitting diode, a photocoupler, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, a further component carrier and a logic chip, and an energy harvesting unit.

12. The component carrier according to claim 1, wherein the electrically conductive layer structures comprise at least one of the group consisting of copper, aluminum, nickel, silver, gold, palladium, and tungsten, any of the mentioned materials being optionally coated with a supra-conductive material.

13. The component carrier according to claim 1, wherein the at least one electrically insulating layer structure comprises at least one of the group consisting of resin, reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up material, epoxy-based build-up film, polytetrafluoroethylene, a ceramic, and a metal oxide.

14. The component carrier according to claim 1,
wherein the component carrier is shaped as a plate; and/or
wherein the component carrier is configured as one of the group consisting of a printed circuit board, and a substrate; and/or
wherein the component carrier is configured as a laminate-type component carrier.

15. The component carrier according to claim 1, wherein the component is embedded in the stack so that a gap of less than 60 μm remains between at least one sidewall of the component and a sidewall of an adjacent one of the layer structures.

16. A method of manufacturing a component carrier, the method comprising:
forming a stack comprising at least one electrically conductive layer structure and/or at least one electrically insulating layer structure;
embedding a component in the stack so that a gap of less than 100 μm remains between at least one sidewall of the component and a sidewall of an adjacent one of the layer structures, wherein a ratio of length to thickness of the component is more than 10 and/or a ratio between a length of the component carrier and a length of the component is less than 3; and
at least partially filling the gap with a filler medium comprising filler particles,
wherein the filler particles have an average particle size of less than 5 μm,
wherein a volume percentage of filler particles in the filler medium and/or in the gap is from 50% to 90%.

17. The method of manufacturing a component carrier according to claim 16, wherein the filler medium comprising filler particles comprises material of the electrically insulating layer structure and the at least partially filling the gap with a filler medium comprises a pressing of material of the electrically insulating layer structure into the gap.

18. A component carrier, comprising:
a stack comprising at least one electrically conductive layer structure and/or at least one electrically insulating layer structure;

a component embedded in the stack so that a gap of less than 100 μm remains between at least one sidewall of the component and a sidewall of an adjacent one of the layer structures, wherein a ratio between a length of the component carrier and a length of the component is less than 3;

a filler medium comprising filler particles, wherein the filler medium at least partially fills the gap, wherein the filler particles have an average particle size of less than 5 μm, wherein a volume percentage of filler particles in the filler medium and/or in the gap is from 50% to 90%.

* * * * *